US007707467B2

(12) United States Patent
Louie et al.

(10) Patent No.: US 7,707,467 B2
(45) Date of Patent: Apr. 27, 2010

(54) INPUT/OUTPUT COMPRESSION AND PIN REDUCTION IN AN INTEGRATED CIRCUIT

(75) Inventors: Benjamin Louie, Fremont, CA (US);
Scott N. Gatzemeier, Boise, ID (US);
Adam Johnson, Boise, ID (US);
Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 327 days.

(21) Appl. No.: 11/709,982

(22) Filed: Feb. 23, 2007

(65) Prior Publication Data
US 2008/0209284 A1 Aug. 28, 2008

(51) Int. Cl.
*G11C 29/00* (2006.01)

(52) U.S. Cl. .................. 714/718; 714/30; 714/719; 714/724; 714/728; 714/726; 714/729; 714/732; 714/736

(58) Field of Classification Search .................. None
See application file for complete search history.

(56) References Cited

U.S. PATENT DOCUMENTS

| | | | | |
|---|---|---|---|---|
| 5,001,713 A * | 3/1991 | Whetsel | ................ | 714/727 |
| 5,325,367 A * | 6/1994 | Dekker et al. | ............... | 714/718 |
| 5,355,369 A * | 10/1994 | Greenberger et al. | ....... | 714/727 |
| 5,553,082 A * | 9/1996 | Connor et al. | .............. | 714/733 |
| 5,631,911 A * | 5/1997 | Whetsel, Jr. | ................ | 714/727 |
| 6,195,774 B1 | 2/2001 | Jacobson | | |
| 6,195,775 B1 | 2/2001 | Douskey et al. | | |
| 6,282,134 B1 * | 8/2001 | Kumar | ................ | 365/201 |
| 6,339,357 B1 * | 1/2002 | Yamasaki et al. | ........... | 327/538 |
| 6,408,414 B1 * | 6/2002 | Hatada | ................ | 714/727 |
| 6,550,038 B2 * | 4/2003 | Shirata | ................ | 716/4 |
| 6,711,708 B1 * | 3/2004 | Shimomura | ................ | 714/727 |
| 6,807,644 B2 | 10/2004 | Reis et al. | | |
| 6,862,705 B1 | 3/2005 | Nesbitt et al. | | |
| 7,032,147 B2 * | 4/2006 | Tanaka | ................ | 714/727 |
| 7,089,470 B1 | 8/2006 | Baeg et al. | | |
| 7,093,176 B2 * | 8/2006 | Nicolaidis et al. | ........... | 714/733 |
| 7,149,943 B2 | 12/2006 | Van Treuren et al. | | |
| 7,159,159 B2 | 1/2007 | Sunter | | |
| 7,325,173 B2 * | 1/2008 | Kikutake et al. | ............ | 714/703 |
| 7,380,187 B2 * | 5/2008 | Dubey | ................ | 714/727 |
| 2002/0062466 A1 | 5/2002 | Noguchi | | |
| 2004/0053429 A1 * | 3/2004 | Muranaka | ................ | 438/17 |
| 2006/0242502 A1 * | 10/2006 | Wang et al. | ................ | 714/724 |
| 2008/0137430 A1 * | 6/2008 | Lasseuguette | .......... | 365/185.18 |

OTHER PUBLICATIONS

Corelis: Innovation in Boundary-Scan (www.jtag.org/products/Boundary-Scan_Tutorial.htm); pp. 1-8.
Corelis: Innovation in Boundary-Scan (www.jtag.org/products/Boundary-Scan_Tutorial.htm); pp. 1-8, Nov. 17, 2006.

* cited by examiner

*Primary Examiner*—John P Trimmings
(74) *Attorney, Agent, or Firm*—Leffert Jay & Polglaze, P.A.

(57) ABSTRACT

An I/O compression apparatus, for testing a memory array and/or a logic circuit, is comprised of a selectable compression circuit that outputs compressed test data from the memory array/logic circuit. An I/O scan register is coupled to each I/O pad for converting serial data to parallel and parallel data to serial in response to a test mode select signal, a test data input, and a test clock.

29 Claims, 11 Drawing Sheets

INPUT/OUTPUT COMPRESSION AND PIN REDUCTION IN AN INTEGRATED CIRCUIT

TECHNICAL FIELD OF THE INVENTION

The present embodiments relate generally to integrated circuits and particularly to memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory. Generally, these can be considered either volatile or non-volatile memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

The manufacturing of memory devices typically includes a testing operation such as the testing standard IEEE 1149.1, also known as Joint Test Action Group (JTAG) boundary scan testing. The JTAG boundary scan method comprises a boundary scan cell coupled to predetermined pins of the integrated circuit. Test data is input to one or more boundary pins of the circuit. Another boundary pin or pins of the circuit are then checked for a predetermined output signal. Since the functions and topology of the tested part are known, the output signal will be known.

This testing can be a complicated, time consuming process. As memory devices become increasingly more complex and the memory density increases, the cost for testing also increases. Since the memory manufacturer has to test a large number of memory devices, even a small increase in test time, multiplied by the large number of memory devices, creates a problem for the manufacturer.

For the reasons stated above, and for other reasons stated below which will become apparent to those skilled in the art upon reading and understanding the present specification, there is a need in the art for a way to reduce the time required to test a large number of integrated circuits.

DETAILED DESCRIPTION

Figure 1:
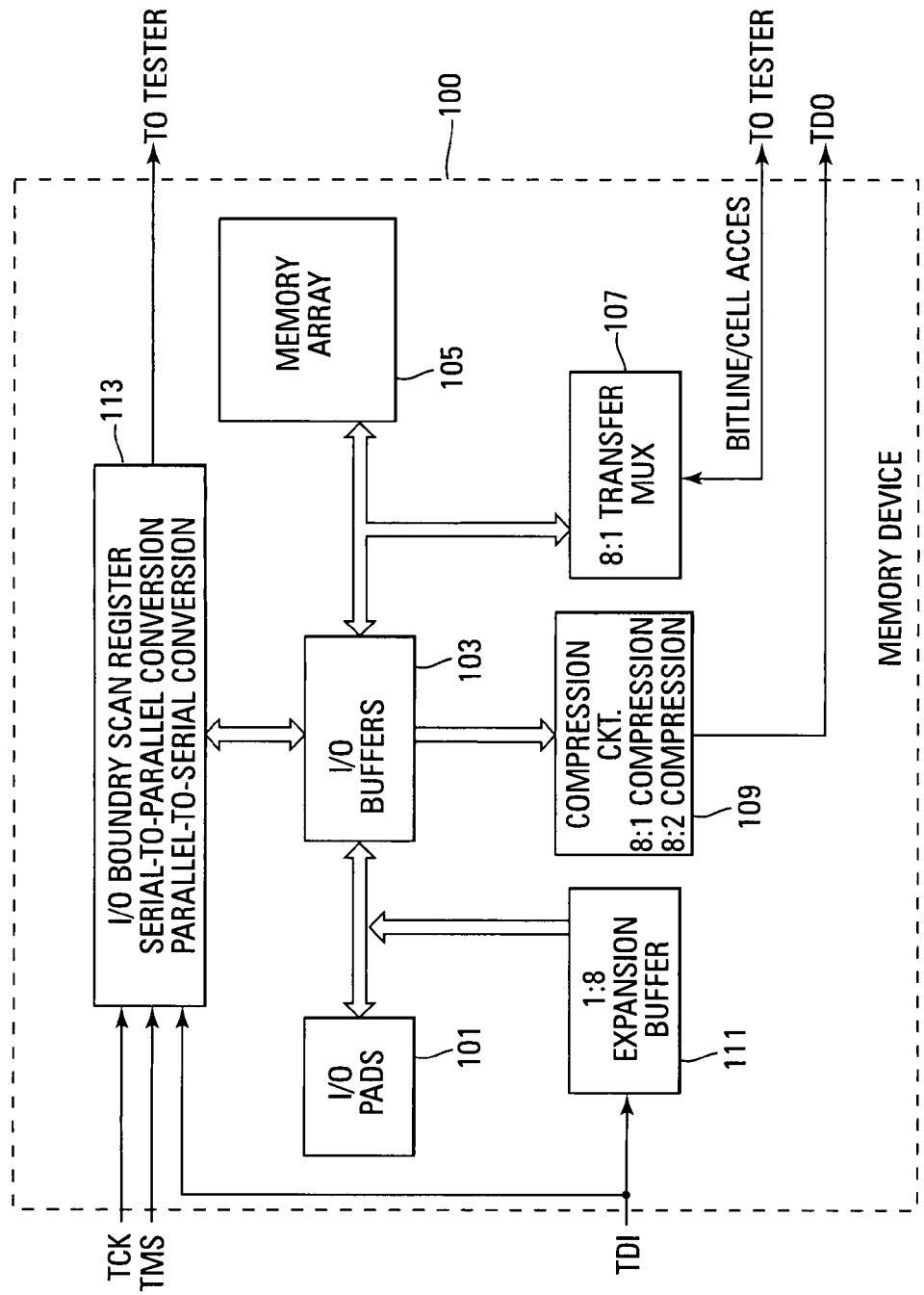
FIG. 1 shows a block diagram of one embodiment of an I/O compression apparatus in an integrated circuit.

In the following detailed description, reference is made to the accompanying drawings that form a part hereof and in which is shown, by way of illustration, specific embodiments. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a block diagram of one embodiment of an I/O compression and pin reduction apparatus for testing an integrated circuit. The embodiment of FIG. 1 illustrates the testing as applied to a non-volatile memory device 100. The illustrated memory device 100 may be one of many different architectures of memory including NAND flash, NOR flash, or AND flash. The describe embodiments, however, are not limited to any one type of integrated circuit.

The illustrated embodiments reduce the integrated circuit pin count to eight signals that are coupled to input/output (I/O) pins during the testing process. These pins include test data in (TDI), test data out (TDO), test clock (TCK), test mode select (TMS), command latch enable (CLE), address latch enable (ALE), write enable (WE*), and read enable (RE*). The WE* and RE* signals are active low as signified by the asterisk. These signals will be described in greater detail subsequently. In one embodiment, the TDI, TDO, TCK, and TMS pins are not connected with bond wires to external pads of the integrated circuit. In an alternate embodiment, the TDI, TDO, TCK, and TMS pins, as well as other pins, can be multiplexed.

The TDI signal is a serial data input signal. This signal is comprised of the test data to be input to the circuit under test. The TDO signal is a serial data output signal. This signal is comprised of the test data that is read out from the circuit under test and is input to the test fixture for comparison with a known/desired response.

The TCK signal is the test clock signal that clocks data into and out of the I/O scan registers 113. The TMS signal is a control signal that selects between parallel and serial operation of the I/O scan registers 113, as illustrated in FIG. 1. When TMS is a logic high, the serial mode is selected. When TMS is a logic low, the normal, parallel mode is selected.

The TMS pin also has a secondary function that is used to initiate the test operation. A high voltage (e.g., approximately 20V) is applied to the TMS pin. This forces the CE* line to go low. Data (e.g., commands and data to a register) can then be clocked in through the serial I/O scan registers, as illustrated subsequently in FIGS. 2, 3, and 4. In an alternate embodiment, other ways besides a high voltage for forcing the CE* line low can be used.

The ALE signal is the active high address latch enable. This signal indicates to the memory device 100 that the I/O lines of the memory contain valid address information. While ALE is active (i.e., logical high), address information can be transferred from the memory controller to the on-chip address register. In one embodiment, the addresses are latched into the register upon transition of another signal such as the write enable signal WE*.

The WE* is the active low write enable signal that is used to gate transfers of data/addresses from the memory controller to the memory device 100. In one embodiment, a low-to-high transition of this signal provides the latch indication. Data are written from the controller to the memory 100 on the rising edge of WE* when CE*, CLE, and ALE are all at a logic low.

The CLE signal is the command latch enable. This active high signal provides an indication to the memory device 100 that command data is available on the I/O lines. The WE* signal can be used to gate the commands into the memory command register.

The RE* signal is the read enable strobe. This is an active low signal that gates data transfers from the memory device 100, over the data or I/O bus, to the memory controller. RE* instructs the memory device 100 to drive requested data onto the data bus.

The memory device 100 is comprised of a plurality of data I/O pads 101. For purposes of clarity, all of the pads are illustrated as one block 101. The I/O pads 101 can also be referred to as the DQ0-DQ7 pads. While a typical integrated circuit under test may have a large quantity of I/O pads, not all of the pads are required to be tested and, therefore, do not require the circuitry illustrated in FIG. 1.

Figure 2:
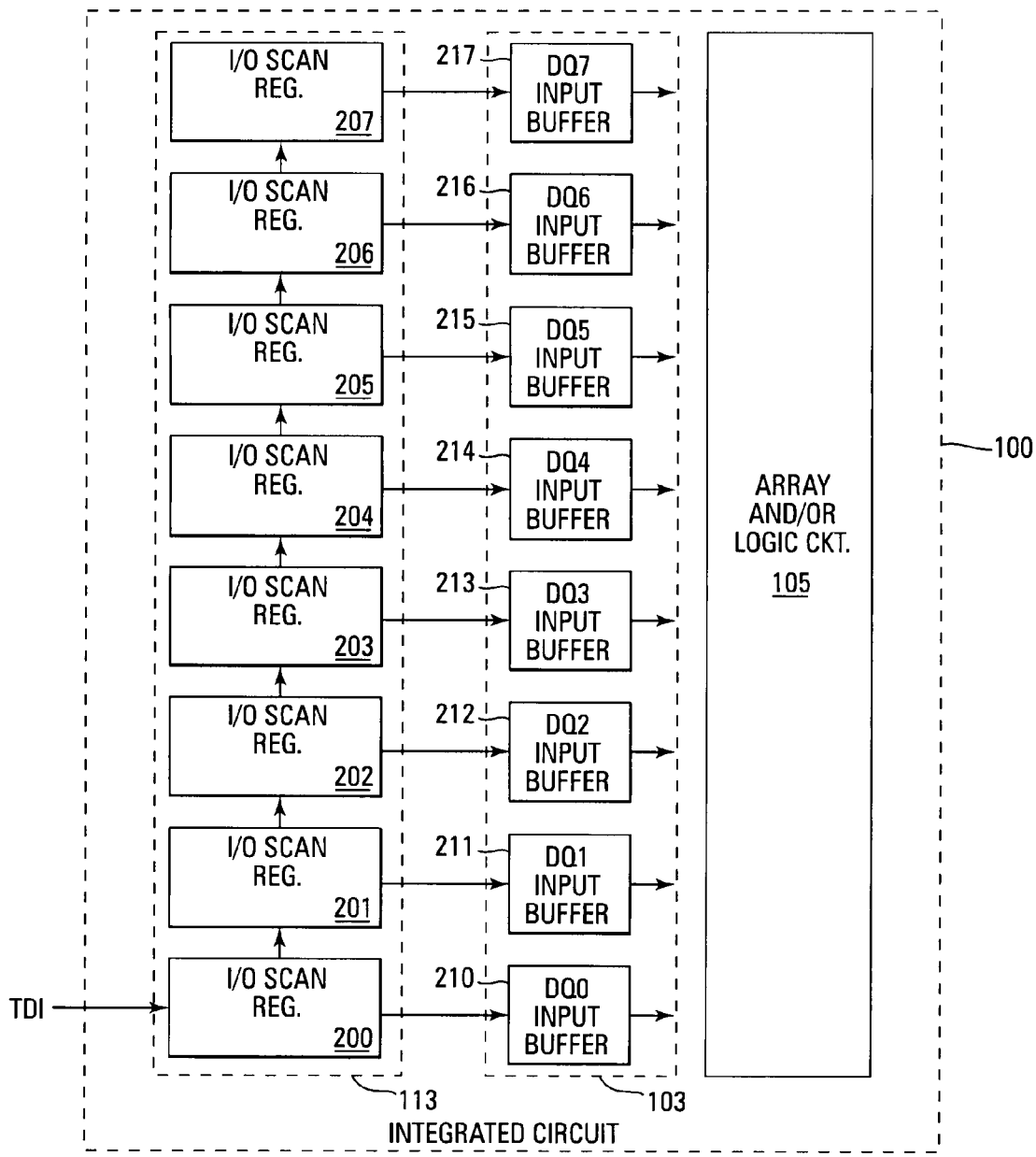
FIG. 2 shows a diagram of one embodiment of an I/O boundary scan input path in an integrated circuit.
Figure 3:
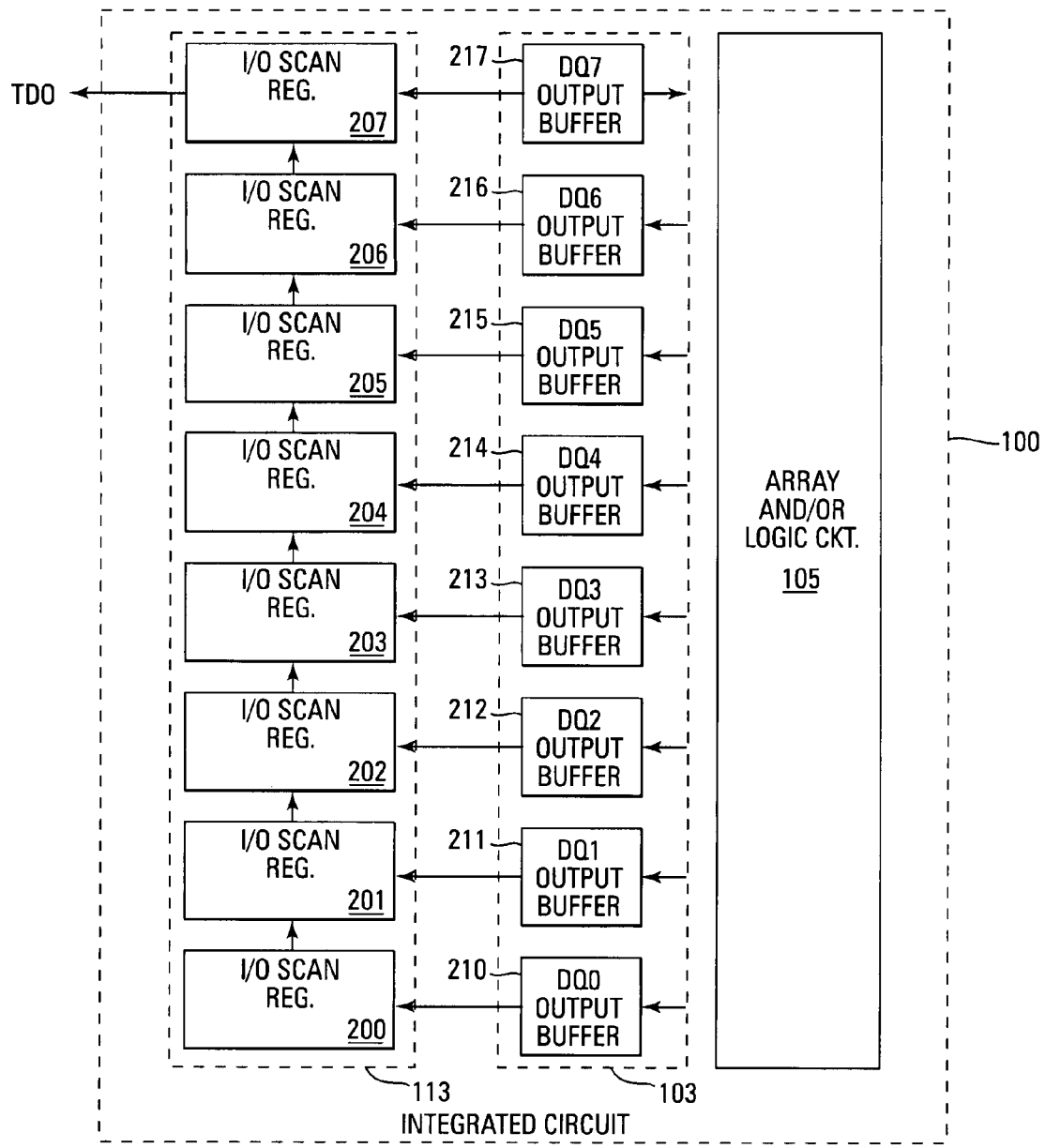
FIG. 3 shows a diagram of one embodiment of an I/O boundary scan output path in an integrated circuit.

The I/O pads 101 are coupled to the I/O buffers 103. These buffers 103 are also illustrated in FIGS. 2 and 3. The I/O buffers 103 are coupled to the memory array 105 or other circuit logic to be tested.

An I/O scan register block 113 is coupled to the TCK TMS, and TDI signals. This block 113 is comprised of a plurality of I/O registers that are responsible for the serial-to-parallel and parallel-to-serial conversion of data to and from the memory array 105 to be tested. The I/O buffers 103 are coupled to the I/O scan registers in a parallel fashion. The serial data from the TDI input is converted to parallel data for input to the I/O buffers 103. The parallel data from the I/O buffers 103 is converted to a serial data stream for output. The output of the I/O scan registers 113 is input to the test fixture (not shown). The I/O scan register block is shown in greater detail with reference to FIGS. 2 and 3.

A 1:8 expansion buffer 111 is also coupled to the serial input data TDI signal. A data bit that is loaded into the buffer 111 is replicated on all eight outputs of the buffer 111. The eight bits of test data are then loaded into the memory array through the I/O buffers 103 for testing. The expansion buffer 111 reduces the number of data bits to be clocked in and, thus, reduces the test time. Instead of having to clock in eight bits, only one bit is required that is then expanded.

An 8:1 and 8:2 compression block 109 is coupled to the I/O buffers 103. The compression block 109 provides a selectable compression ratio of either eight-to-one or eight-to-two, as required by different embodiments. The output of the compression block 109 is coupled to the TDO signal. The compression is turned on and the desired compression ratio is selected by writing a predetermined control word to the appropriate register.

The compression output provides either one bit for every eight bits or two bits for every eight bits. In one embodiment, the output is a logical one if all eight bits are one, a logical zero if all eight bits are zero, and if the eight bits do not match, the compression block 109 output is a high impedance state.

In another embodiment, a DRAM toggle is output when the eight bits do not match. The DRAM toggle is a transition from a logical one to a logical 0 if the eight bits do not match.

An 8:1 transfer multiplexer 107 is coupled to the memory array 105. The mux 107 enables the test fixture to access the bit lines of the memory array 105.

FIG. 2 illustrates a block diagram of one embodiment of an I/O scan input path in the memory device 100 of FIG. 1. The input is comprised of the serial TDI signal that is input to one of the I/O scan registers 200. In the illustrated embodiment, the TDI signal is input to the DQ0 I/O scan register 200. The signal is then clocked serially from the DQ0 I/O scan register 200 upward through the remaining I/O scan registers 201-207. The outputs of each register 200-207 is output serially to its respective DQx input buffer 210-217. The input buffers 103 are then input to the memory array and/or logic circuit 105 under test.

FIG. 3 illustrates a block diagram of one embodiment of an I/O scan output path in the memory device 100 of FIG. 1. The memory array and/or logic circuit under test 105 is coupled to the DQ0-DQ7 output buffers 103. The individual buffers 210-217 are coupled to their respective I/O scan registers 200-207. The data from these registers 200-207 are clocked serially to the TDO output. As previously described, the TDO output is coupled to the test fixture in order to compare the clocked out test data to the known data that was originally stored.

Figure 4:
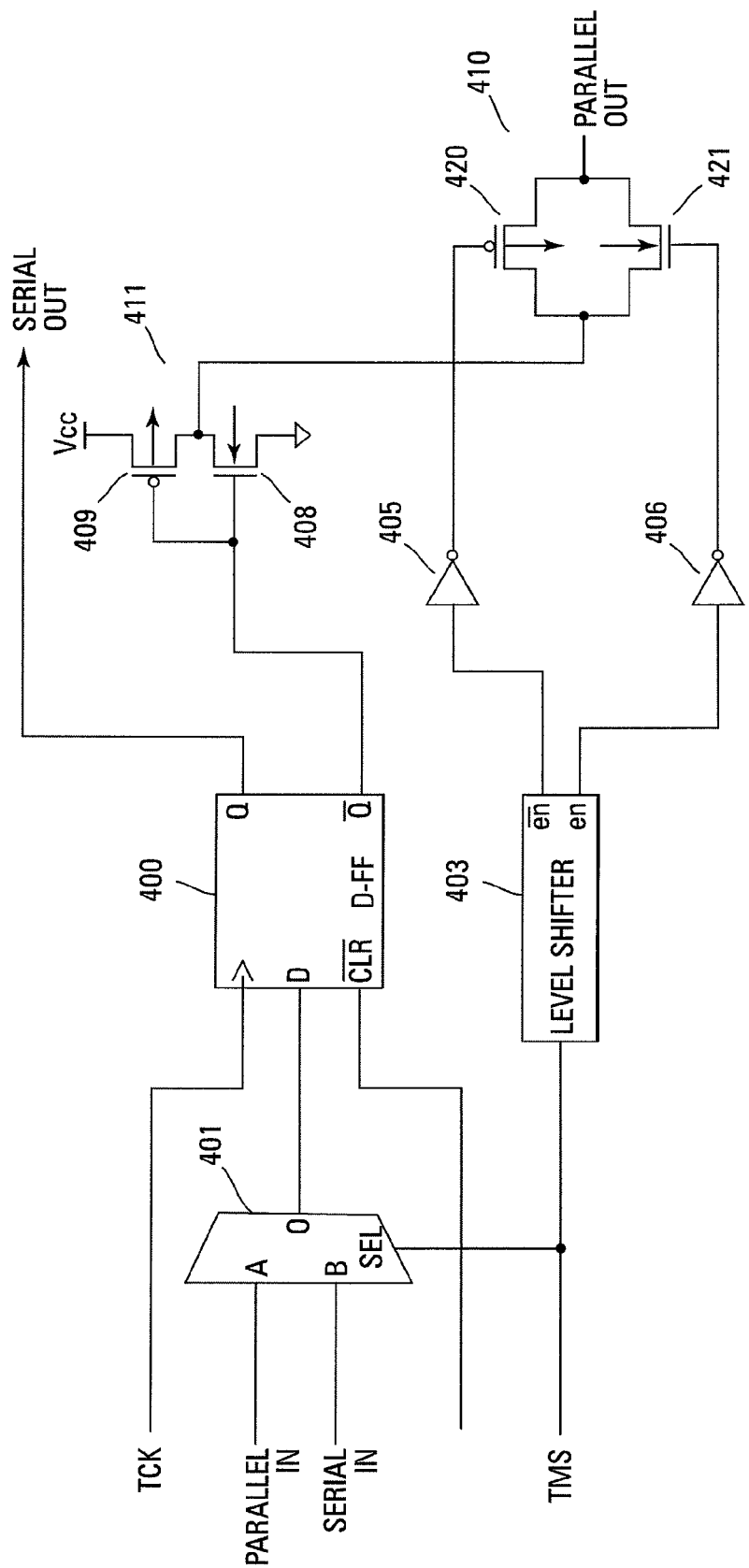
FIG. 4 shows a block diagram of one embodiment of the boundary scan registers as illustrated in FIGS. 2 and 3.

FIG. 4 illustrates a block diagram of one embodiment of an I/O scan register as illustrated in FIGS. 2 and 3. This circuit is provided only for purposes of illustration as the present embodiments can be achieved through various different circuits.

The register is comprised of a D flip-flop 400 that is used to latch data. The data is input through a multiplexer 401 that has inputs coupled to a parallel in line and a serial in line. The TMS signal is coupled to the control input of the mux 401 to select between the parallel mode and the serial mode as previously discussed.

The TCK clock signal is coupled to the D-FF clock input to clock the data into the D-FF. The non-inverted output (Q) of the D-FF is output as the serial output of the register. The inverted output (Q*) of the D-FF is output through two transistor output circuits 410, 411 that act as pass gate circuits between the circuit of FIG. 4 and the parallel output.

A level shifter block 403 is coupled to the TMS signal. The level shifter translates the incoming TMS logic signal to an outgoing signal that has a higher $V_{CC}$ bias. For purposes of illustration, the internal VCC is set at 2.3V while the external VCC can vary between 2.7V and 3.6V.

The outputs of the level shifter circuit 403 are coupled to two inverters 405, 406 that are biased to the external VCC. These inverters 405, 406 are used for buffering to help drive the pass gate load circuit 410. This circuit 410 acts as a pass gate circuit that blocks the output of circuit 411 from the DQ pads when the test mode embodiments are not in use. This prevents any potential forward biasing of transistors when a user of the memory device drives the DQ pads during normal operation.

As an example of operation of this circuit, if TMS is a logic high to select the serial mode of the register, the "B" input of the mux 401 is selected such that the serial input data is output from the mux 401 and input to the D-FF 400. This data is clocked into the flip flop by TCK.

Similarly, if the parallel mode is selected by TMS being at a logic low, the "A" input of the mux 401 is selected and the data is clocked into the D-FF 400 with TCK. A logic high output from the Q* output of the D-FF 400 turns on the lower n-channel transistor 408 while the top p-channel transistor 409 is turned off. The low TMS signal turns on the p-channel transistor 420 and the n-channel transistor 421. If the Q* output is a logic low, the n-channel transistor 408 is turned off while the p-channel transistor 409 is turned on, thus outputting a logic high signal.

Figure 5:
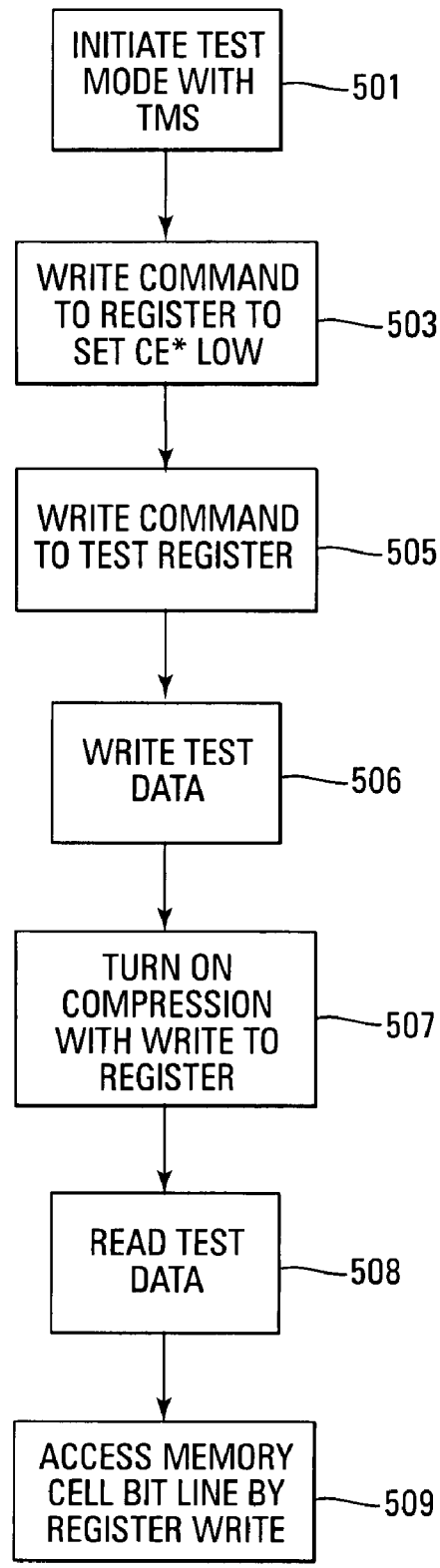
FIG. 5 shows a flow chart of one embodiment of a method for I/O compression during testing of an integrated circuit.

FIG. 5 illustrates a flowchart of one embodiment of a method for I/O compression during testing of an integrated circuit. The method begins with the initiation of the test mode by biasing the TMS pin 501 with a high voltage that is greater than the typical operating voltages for the integrated circuit under test. For example, if $V_{CC}$ is 10V, the TMS pin can be biased with 20V.

The CE* line is then brought low by writing a command to a command register 503 while TMS is at the high voltage. A command is then written to a test register 505 while the WE* pin is held low and the ALE pin is held high. This enables the loading of addresses into the address registers. Address register loads are comprised of an eight bit address and an eight bit data field. In an alternate embodiment, a write protect pin (WP) can also be forced low, as well as other static control pins, to accomplish substantially the same result.

Test data can then be written to the memory array/logic circuit for testing 506. Many different test patterns can be used as test data such as all ones, all zeros, alternating ones and zeros, or other test patterns.

The compression function can then be turned on with a write of an address and data to the test register 507. The eight bit address field is the address of the register while the eight bit data field selects the options available for data compression. In one embodiment, these options are 8:1 compression, 8:2 compression, tri-state/high impedance condition when test data fails, and DRAM toggle when test data fails.

The test data can be read from the memory array/logic circuit 508. The compressed output is indicative of whether a failure has occurred. For example, if a compressed logical one is read and all ones had been written as test data, the test has passed. Similarly, if all logical zeros had been written as test data and a compressed logical zero is read, the test has passed. If the data does not match, a tri-state condition is read or the DRAM toggle is read, depending on which is selected.

The tester can also access a memory cell bit line by writing to a particular register 509. This is accomplished by writing the appropriate register address with the data field comprising the appropriate data bits. For example, three bits of the data field allows access, through the 8:1 transfer mux 107 of FIG. 1, to eight of the bit lines of the memory array 105.

Figure 6:
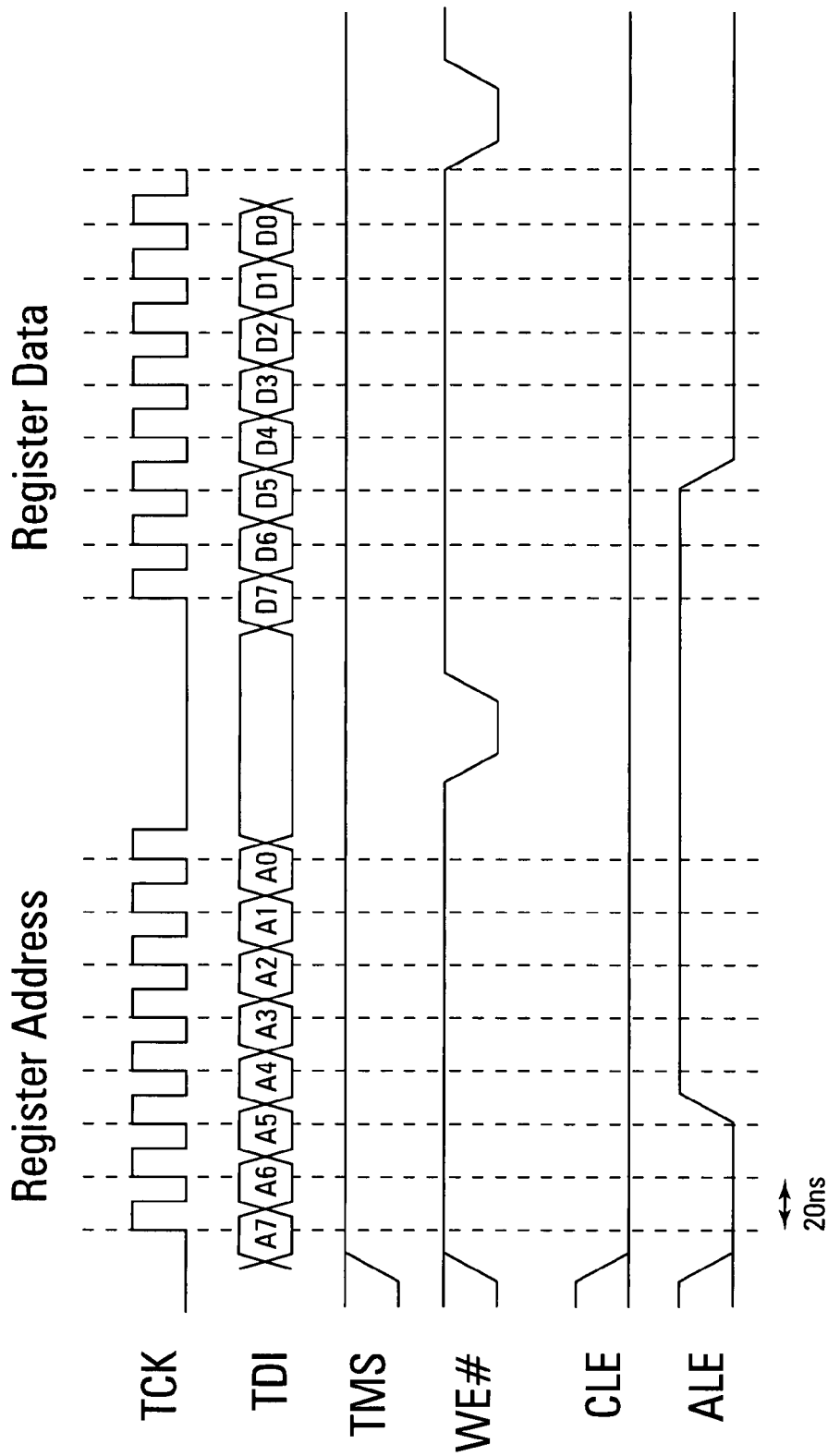
FIG. 6 shows a timing diagram of one embodiment of the signals used during a register write operation.

FIG. 6 illustrates a timing diagram of one embodiment of a register write operation as discussed in FIG. 5. The left side of the diagram illustrates the register address write operation while the right side illustrates the register data write operation. This operation is used to enable the different compression schemes as well as to access the memory array bit lines. The address corresponds to the appropriate register while the data corresponds to the appropriate control bits for the desired operation.

The serially input address (A0-A7) on the TDI pin is clocked in on the rising edge of TCK. This occurs while TMS is high (indicating a serial operation), WE* is high, CLE is low, and ALE is high prior to WE* being high. For purposes of illustration, TCK has a period of 20 ns.

After a predetermined delay time period (i.e., 47 ns), the register data (D0-D7) is serially clocked in on the TDI pin on the rising edge of TCK. During this period, TMS is high, WE* is high, CLE is low, and ALE is high before the rising edge of the next WE* pulse. In the illustrated embodiment, the entire register load operation uses 347 ns.

Figure 7:
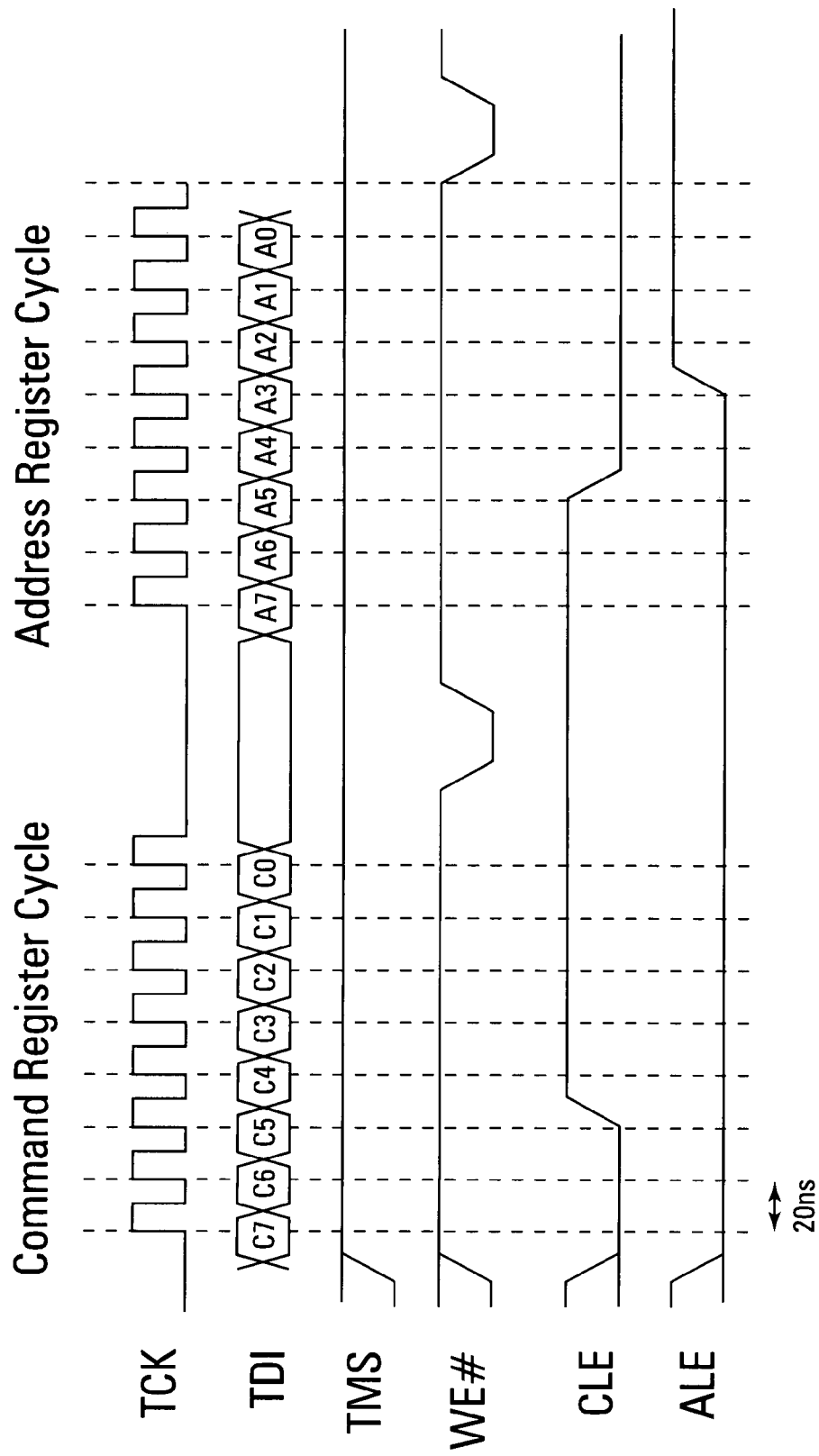
FIG. 7 shows a timing diagram of one embodiment of the signals used during command latch and address latch cycles.

FIG. 7 illustrates a timing diagram of one embodiment of a command/address register operation as discussed in FIG. 5. The left side of the diagram illustrates the command register cycle while the right side illustrates the address register cycle. This operation is used to write a command word into the appropriate register. For example, the command word might be written to the command register to cause CE* to go low or the command might be written to the test register to initiate the test operation.

TCK, with a 20 ns clock cycle, clocks in the eight bit command data (C0-C7) serially on TDI. This occurs while TMS is logically high, WE* is logically high, and CLE goes low for two clock cycles.

WE* is pulsed after the last rising edge of the clock while TMS and CLE are still high and ALE is low. The address cycle then starts by clocking in the address data on the rising edge of TCK. CLE goes low after two clock cycles and ALE goes high after four clock cycles. In the illustrated embodiment, the entire register load operation occurs in 347 ns.

Figure 8:
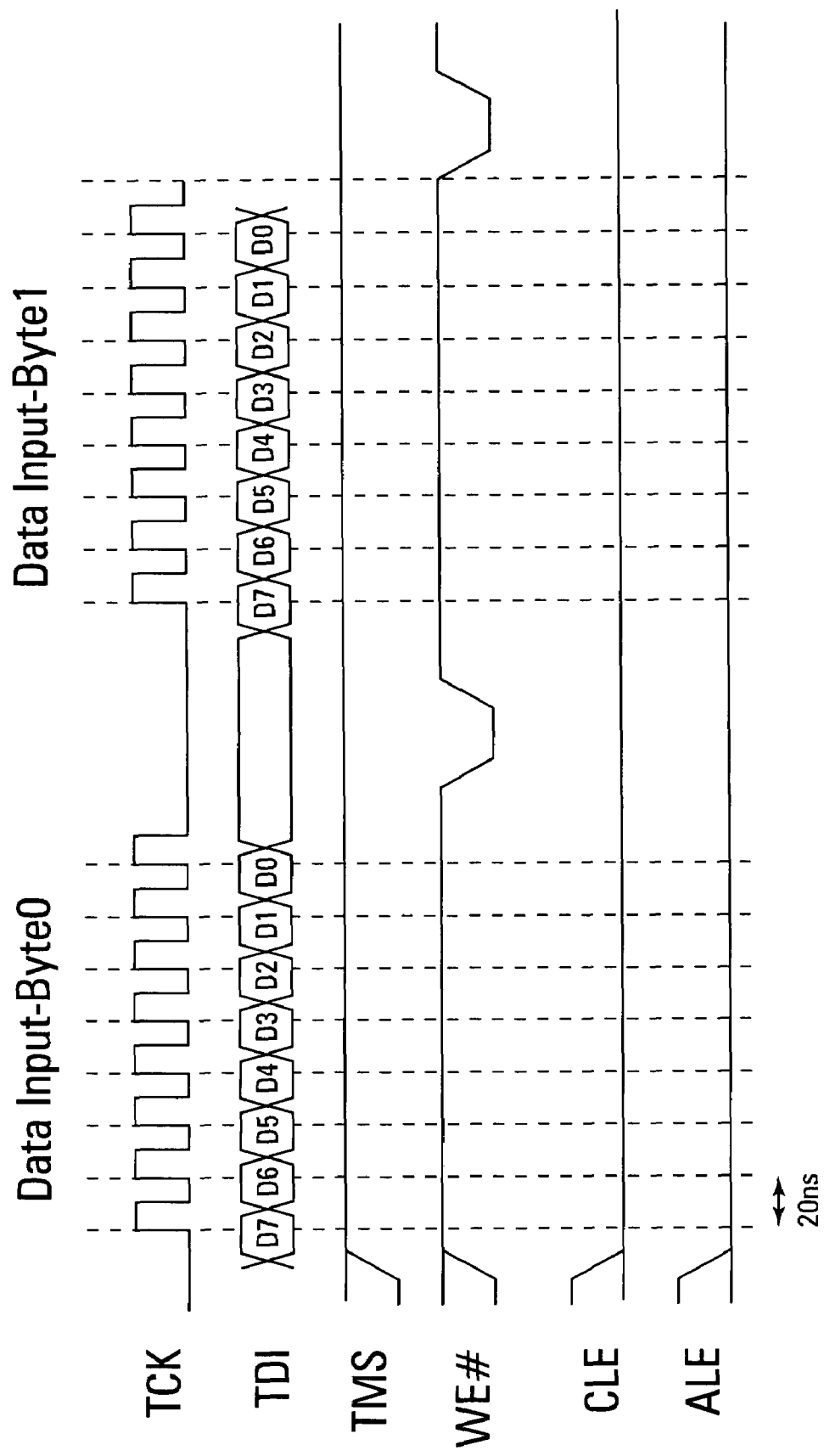
FIG. 8 shows a timing diagram of one embodiment of the signals used during a serial data input operation.

FIG. 8 illustrates a timing diagram of one embodiment of a serial data input operation. The left side of the diagram illustrates data input of Byte0 while the right side illustrates data input of Byte1. This operation is used to serially load test data into the memory for testing of the memory cells and/or logic circuits.

Byte0 is clocked in serially with the rising edge of TCK while TMS and WE* are high and CLE and ALE are low. Approximately 42 ns after the last rising clock edge of Byte0, WE* is pulsed low and Byte1 is clocked in using substantially the same procedure.

Figure 9:
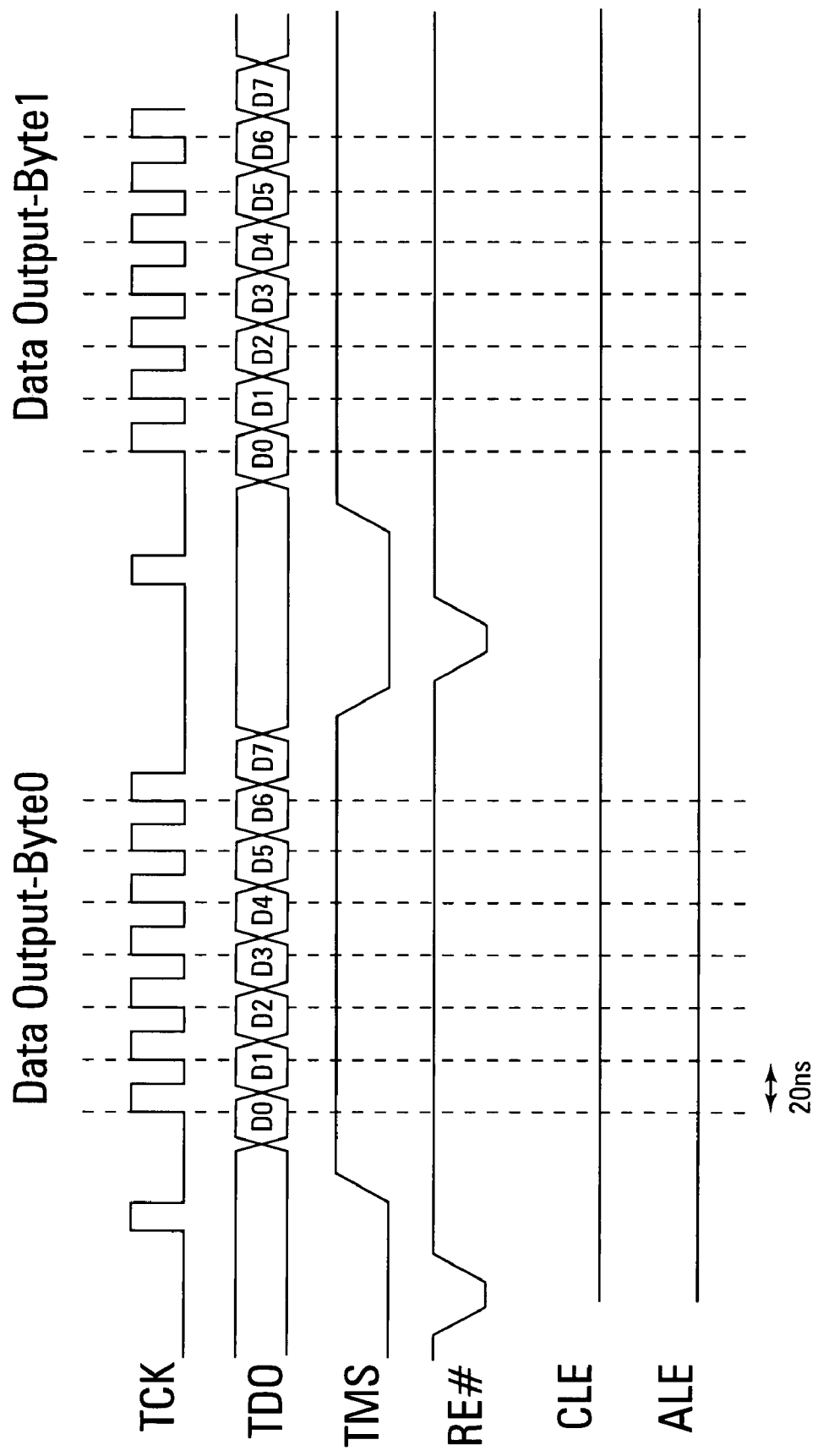
FIG. 9 shows a timing diagram of one embodiment of the signals used during a serial data output operation.

FIG. 9 illustrates a timing diagram of one embodiment of a serial data output operation. The left side of the diagram illustrates the serial data out of Byte0 while the right side illustrates the serial data out of Byte1. This operation is used to read test data from the memory cells and/or logic circuit in order to compare the read data with the known stored data to detect failed memory cells/logic elements.

After TMS goes high and RE* is pulsed low to enable a serial data read operation, D0-D7 are clocked out on TDO on the rising edge of TCK. Both CLE and ALE are low during this operation. After Byte0 is clocked out, TMS goes back low.

The Byte1 operation is then initiated by RE* being pulsed low. TMS goes back high and D0-D7 are then clocked out serially. CLE and ALE are both low during this operation.

The previously described timing diagrams are for purposes of illustration only. Alternate embodiments can have other times and signal relationships. For example, the falling edge of TCK may be used as well as clocking on both edges of TCK.

Figure 11:
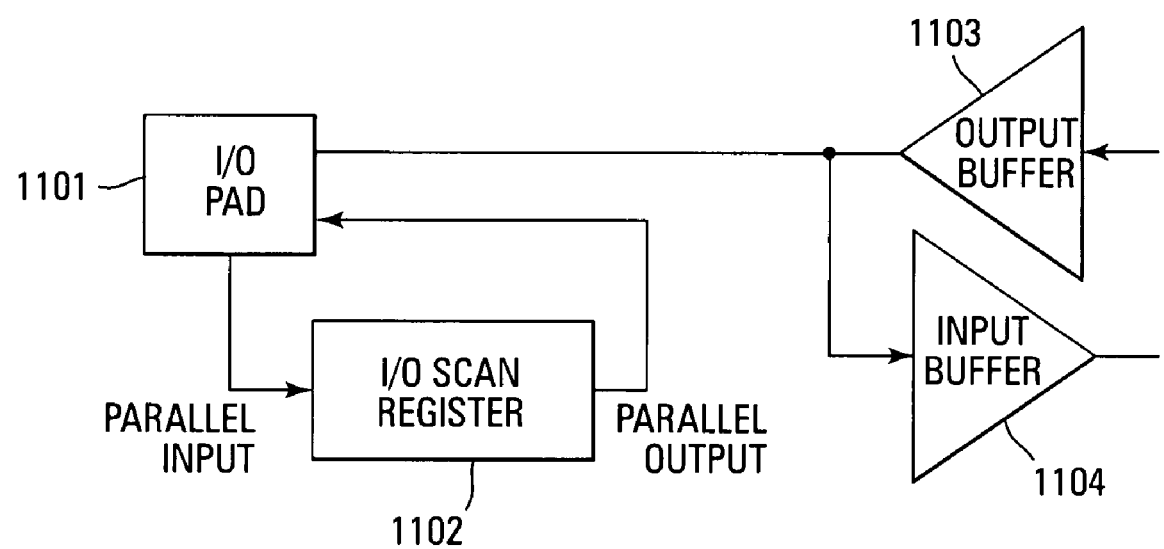
FIG. 11 shows a block diagram of one embodiment of an open/shorts check.

FIG. 11 illustrates a block diagram of one embodiment of an open/shorts check in accordance with I/O scan architecture described previously. This architecture enables testing of open circuits and short circuits without affecting the speed of the serial path. This figure shows only one I/O pad configuration. The remaining I/O pads and I/O scan registers are configured in a substantially similar manner.

The I/O scan register 1102 parallel input and output are coupled to the I/O pad 1101. The input from the I/O scan register 1102 ensures a path between the I/O pad 1101 and the input buffer 1104 The output from the I/O scan register 1102 ensures a path between the output buffer 1103 and the I/O pad 1101.

Figure 10:
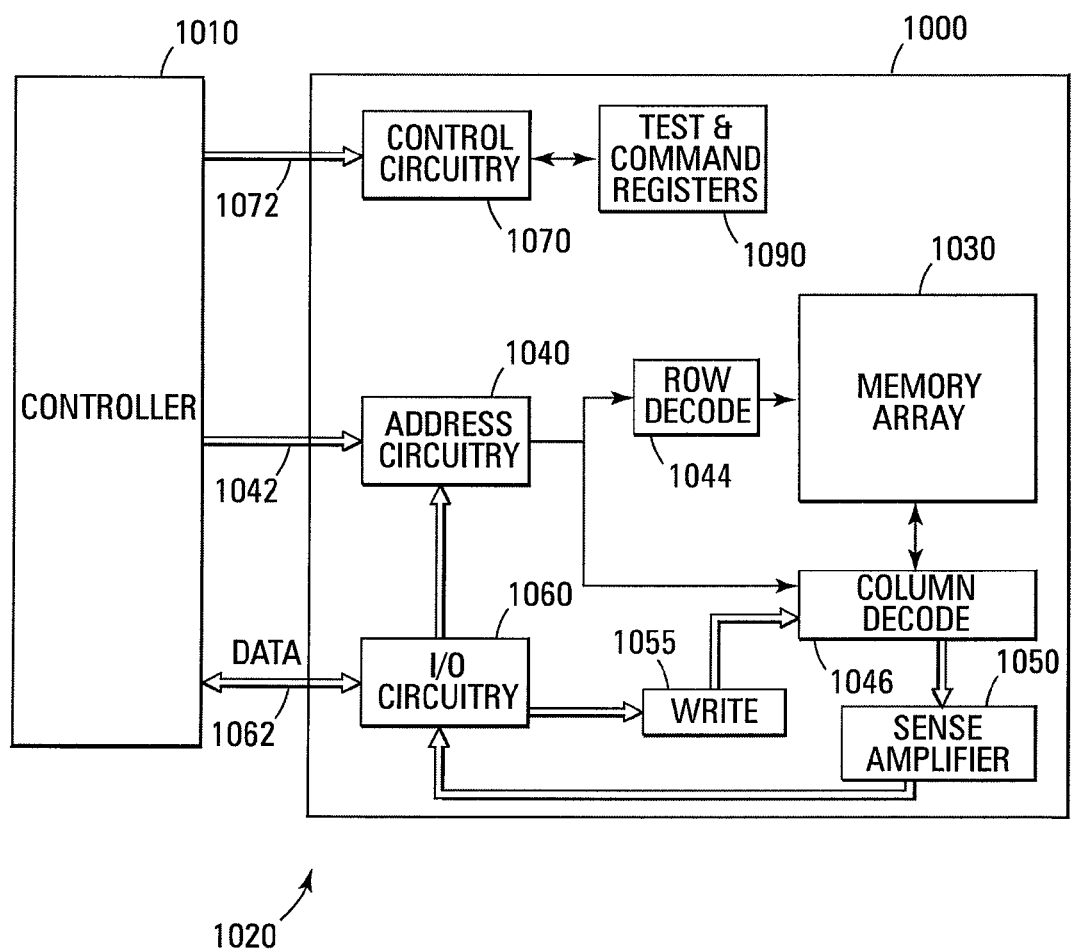
FIG. 10 shows a block diagram of one embodiment of a test system.

FIG. 10 illustrates a functional block diagram of a memory device 1000 that can incorporate a memory device as previously described. The memory device 1000 is coupled to a controller device 1010. The controller device 1010 may be a microprocessor, a memory controller, a test fixture controller, or some other type of controlling circuitry. The memory device 1000 and the processor 1010 form part of a test system 1020. The memory device 1000 has been simplified to focus on features of the memory that are helpful in understanding the present invention.

The memory device includes an array of memory cells 1030 that can include flash memory cells or some other type of non-volatile memory cells. The memory array 1030 is arranged in banks of rows and columns. The control gates of each row of memory cells is coupled with a wordline while the drain and source connections of the memory cells are coupled to bit lines. As is well known in the art, the connection of the cells to the bit lines depends on whether the array is a NAND architecture, a NOR architecture, an AND architecture, or some other array architecture.

An address buffer circuit 1040 is provided to latch address signals provided on address input connections A0-Ax 1042. Address signals are received and decoded by a row decoder 1044 and a column decoder 1046 to access the memory array 1030. It will be appreciated by those skilled in the art, with the benefit of the present description, that the number of address input connections depends on the density and architecture of the memory array 1030. That is, the number of addresses increases with both increased memory cell counts and increased bank and block counts.

The memory device 1000 reads data in the memory array 1030 by sensing voltage or current changes in the memory array columns using sense amplifier/buffer circuitry 1050. The sense amplifier/buffer circuitry, in one embodiment, is coupled to read and latch a row of data from the memory array 1030. Data input and output buffer circuitry 1060 is included for bi-directional data communication over a plurality of data connections 1062 with the controller 1010. Write circuitry 1055 is provided to write data to the memory array.

Control circuitry 1070 decodes signals (e.g., ALE, CLE, CE*, RE*) provided on control connections 1072 from the processor 1010. These signals are used to control the operations on the memory array 1030, including data read, data write, and erase operations. The control circuitry 1070 may be a state machine, a sequencer, or some other type of controller.

Registers 1090 are coupled to the control circuitry 1070. These register include the command, test, and compression selection registers as discussed previously. This register block 1090 can also include other registers as needed for operation and testing of the memory device.

The memory device illustrated in FIG. 10 has been simplified to facilitate a basic understanding of the features of the memory and is for purposes of illustration only. A more detailed understanding of internal circuitry and functions of memories are known to those skilled in the art. Alternate embodiments may include a memory cell of one embodiment of the present invention in other types of electronic systems.

CONCLUSION

In summary, the embodiments discussed herein enable a pin reduction and I/O compression during I/O scan testing. This scheme allows uncompressed data to move in and out of the integrated circuit while also providing various compression schemes to reduce transfer of data during testing. The present embodiments provide for uncompressed data input such as command and address in addition to uncompressed output through the TDO pin. An additional embodiment provides an 8:1 transfer pass gate mux for analog bit line access.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An input/output (I/O) compression apparatus in an integrated circuit having a logic circuit to be tested, the apparatus comprising:
   a conversion circuit coupled to the logic circuit, the conversion circuit having a serial data input and configured to perform both serial-to-parallel and parallel-to-serial conversion to write test data to and read test data from the logic circuit; and
   a compression circuit coupled to the conversion circuit for outputting the read test data from the logic circuit wherein a compression option of the compression circuit is selectable in response to an address and data such that the address selects a test register and the data selects the compression option.

2. The apparatus of claim 1 wherein the logic circuit to be tested includes a memory array.

3. The apparatus of claim 1 and further including an I/O buffer coupling the conversion circuit to the compression circuit.

4. The apparatus of claim 3 and further comprising a data I/O pad coupled to the I/O buffer.

5. The apparatus of claim 1 wherein the conversion circuit is an I/O scan register that is coupled to a test clock signal, a test mode select signal, and a test data in signal.

6. The apparatus of claim 5 wherein the test data in signal is a serial data signal.

7. The apparatus of claim 5 wherein a state of the test mode select signal indicates one of a parallel mode or a serial mode.

8. The apparatus of claim 1 wherein the compression option comprises selectable compression ratios, a high impedance condition, and a DRAM toggle.

9. An I/O compression test apparatus in a memory device having a plurality of data I/O pads and a memory array, the apparatus comprising:
   a conversion circuit coupled to the memory array and to a data I/O pad, the conversion device configured to perform both serial-to-parallel and parallel-to-serial conversion to write test data to and read test data from the memory array in response to a test clock signal, a test mode select signal, and a test data input signal;
   an I/O buffer for coupling the conversion circuit to the memory array; and
   a compression circuit coupled through the I/O buffer to the conversion circuit and the memory array for outputting the read test data from the memory array in a selectable compressed format wherein a compression option of the compression circuit is selectable in response to an address and data such that the address selects a test register and the data selects the compression option that includes the selectable compressed format.

10. The apparatus of claim 9 wherein the conversion circuit is further configured to be coupled to a test fixture.

11. The apparatus of claim 9 wherein the memory device is a non-volatile memory device.

12. The apparatus of claim 11 wherein the non-volatile memory device is one of a NAND flash memory or a NOR flash memory.

13. The apparatus of claim 9 and further including an expansion buffer having an input coupled to the test data input signal and an output coupled to the plurality of I/O buffers, the expansion buffer configured to accept a data bit from the test data input signal and replicate that data bit into a plurality of data bits.

14. The apparatus of claim 9 and further including a read enable signal, a write enable signal, an address latch enable signal, and a command latch enable signal coupled to the memory device.

15. A memory device comprising:
a memory array having columns coupled to bit lines; and
an input/output (I/O) compression test apparatus coupled to the memory array, the apparatus comprising:
a plurality of I/O scan registers each coupled to the memory array, each I/O scan register configured to perform both serial-to-parallel and parallel-to-serial conversion to write test data to and read test data from the memory array in response to a test clock signal, a test mode select signal, and a test data input signal;
an I/O buffer coupled between each I/O scan register and the memory array; and
a compression circuit coupled to the plurality of I/O scan registers for outputting the read test data from the memory array in a selectable compressed format wherein a compression option of the compression circuit is selectable in response to an address and data such that the address selects a test register and the data selects the compression option that includes the selectable compressed format.

16. The memory device of claim 15 and further including a pass gate multiplexer coupled to the memory array for allowing analog access to the bit lines.

17. The memory device of claim 15 wherein the selectable compressed format comprises one of an 8:1 ratio or an 8:2 ratio.

18. The memory device of claim 15 wherein the test data input signal is a serial data signal and the test mode select signal provides an indication of whether the apparatus is in a serial mode or a parallel mode.

19. The memory device of claim 15 and further including a plurality of data I/O pads, each data I/O pad coupled to an I/O scan register and an I/O buffer.

20. The memory device of claim 15 wherein each I/O scan register is comprised of:
a multiplexer having a serial data input and a parallel data input that are selectable in response to the test mode select signal;
a flip-flop coupled to the multiplexer for storing selected data and outputting the serial data; and
an output circuit coupled to the flip-flop for controlling output of the parallel data.

21. The memory device of claim 20 wherein the output circuit is comprised of a plurality of transistors that are controlled by an inverted output of the flip-flop and the test mode select signal.

22. A method for testing an integrated circuit having a logic circuit, the method comprising:
initiating a test mode in response to a voltage on a test mode pin;
writing test data to the logic circuit;
writing an address and data wherein the address selects a test register to store the data that selects a compression option including one of a plurality of compression ratios, a high impedance condition, or a DRAM toggle;
turning on a compression circuit that is configured to execute the selected compression option in response to the data in the test register; and
reading compressed test data.

23. The method of claim 22 wherein the compressed test data comprises a logical one if all logical ones are read, a logical zero if all logical zeros are read, or a high impedance state when both logical ones and logical zeros are read.

24. The method of claim 22 wherein the compressed test data comprises a logical one if all logical ones are read, a logical zero if all logical zeros are read, or a DRAM toggle condition when both logical ones and logical zeros are read.

25. The method of claim 22 wherein the voltage is greater than a supply voltage for the integrated circuit.

26. A test system comprising:
a test controller for generating test control signals including a test clock signal, a test mode select signal, and a test data input signal; and
a memory device coupled to the test controller and operating in response to the test control signals, the device comprising:
a memory array having columns coupled to bit lines;
a plurality of data input/output (I/O) pads;
a plurality of I/O scan registers each coupled to a different I/O pad, each I/O scan register configured to perform both serial-to-parallel and parallel-to-serial conversion to write test data to and read test data from the memory array in response to the test clock signal, the test mode select signal, and the test data input signal;
an I/O buffer coupled between each data I/O pad and the memory array; and
a compression circuit coupled to the plurality of I/O scan registers for outputting the read test data from the memory array in a selectable compressed format wherein a compression option of the compression circuit is selectable in response to an address and data such that the address selects a test register and the data selects the compression option.

27. The system of claim 26 wherein the memory device further comprises a transfer multiplexer for accessing the bit lines.

28. The system of claim 26 wherein the test controller is further configured to receive serial test data output from the compression circuit.

29. The system of claim 26 wherein the memory device further includes a 1:8 expansion buffer that is configured to receive one bit that is replicated into 8 bits.

* * * * *

UNITED STATES PATENT AND TRADEMARK OFFICE
CERTIFICATE OF CORRECTION

PATENT NO. : 7,707,467 B2 Page 1 of 1
APPLICATION NO. : 11/709982
DATED : April 27, 2010
INVENTOR(S) : Benjamin Louie et al.

It is certified that error appears in the above-identified patent and that said Letters Patent is hereby corrected as shown below:

In column 9, line 51, in Claim 20, after "outputting" delete "the".

Signed and Sealed this

Fifteenth Day of June, 2010

David J. Kappos
*Director of the United States Patent and Trademark Office*